United States Patent [19]
Peterson
[11] 4,020,762
[45] May 3, 1977

[54] LASER IMAGING A LANOGRAPHIC PRINTING PLATE

[75] Inventor: John O. H. Peterson, Cape Elizabeth, Maine
[73] Assignee: Scott Paper Company, Philadelphia, Pa.

[22] Filed: Oct. 14, 1975
[21] Appl. No.: 622,356

Related U.S. Application Data

[63] Continuation of Ser. No. 434,257, Jan. 17, 1974, abandoned.

[52] U.S. Cl. .................................. 101/467; 96/33; 96/36.3; 346/76 L; 101/471
[51] Int. Cl.[2] ...................... B41C 1/10; G03F 7/10; G03C 5/17; G03C 5/18
[58] Field of Search .............. 96/33, 36.3; 101/467, 101/470, 471; 346/76 L

[56] References Cited

UNITED STATES PATENTS

| | | | |
|---|---|---|---|
| 3,010,390 | 11/1961 | Buskes | 101/467 |
| 3,475,760 | 10/1969 | Carlson | 346/76 L |
| 3,493,371 | 2/1970 | Poot | 96/36.3 X |
| 3,519,463 | 7/1970 | Baum | 101/470 |
| 3,619,157 | 11/1971 | Brinkman | 101/463 X |
| 3,620,812 | 11/1971 | Boutle et al. | 96/33 |
| 3,660,088 | 5/1972 | Lundsager | 96/36.3 |
| 3,664,737 | 5/1972 | Lipp | 355/18 |
| 3,793,025 | 2/1974 | Vrancken | 101/464 X |
| 3,836,709 | 9/1974 | Hutchison | 96/33 |
| 3,867,150 | 2/1975 | Ketley | 96/27 H |
| 3,934,503 | 1/1976 | Kinney et al. | 96/36.4 |

OTHER PUBLICATIONS

IBM Tech. Disc. Bulletin, vol. 12, No. 8, Jan. 1970, Anderson et al.

*Primary Examiner*—Clyde I. Coughenour
*Attorney, Agent, or Firm*—R. Duke Vickrey; J. A. Weygandt

[57] ABSTRACT

A planographic printing plate which is imaged by means of a laser beam in combination with overall exposure to ultraviolet light and developed by means which are conventional in lithographic art.

2 Claims, No Drawings

LASER IMAGING A LANOGRAPHIC PRINTING PLATE

This is a continuation of application Ser. No. 434,257, filed Jan. 17, 1974, now abandoned.

BACKGROUND OF THE INVENTION

1. Field of the Invention

This invention relates to planographic printing plates.

2. Description of the Prior Art

Recently, methods have been proposed to utilize a laser beam to image a planographic (offset) or raised-image (letter press) printing plate, see for example U.S. Pat. Nos. 3,506,779 granted Apr. 14, 1970 (Brown et al) "Laser Beam Type setter" and U.S. Pat. No. 3,664,737 granted May 23, 1972 (Lipp) "Printing Plate Recording by Direct Exposure". While the laser offers great promise in producing high resolution printing plates, there has thus far been limitations which have prevented success. In those systems which operate by removing material to form an image, the speed of production is slower than that achieved with conventional chemical etching. It has been proposed in the above-mentioned U.S. Pat. No. 3,664,737 to directly image a photosensitive medium with a laser beam which emits light in the ultraviolet region. The disadvantage of such lasers is, however, that they are presently very expensive and do not have a high power output.

It is therefore an object of this invention to improve the production of high quality printing plates by the use of a laser.

SUMMARY

The present invention provides a planographic printing plate comprising a layer which contains an organic-solvent-soluble negative-working diazo compound, carbon particles and nitrocellulose. An image is recorded on the plate by writing with a laser in a conventional manner. Selected areas of the coating are removed by the laser beam so as to define an image on the plate. The coating utilized in the present invention absorbs radiation in the infra red range. A suitable beam may be applied by YAG (yttrium-aluminum-garnet) laser which has an effective wave length of about 1.06 microns or by an argon laser beam which has an effective length in the range of from 0.48 to about 0.52 micron. The beam of radiant energy is applied to the coating to vaporize and remove it in selected areas so as to expose the underlying substrate.

For reasons not fully understood by applicant, the areas radiated by the laser become sensitive to ultraviolet light. As a result the plate can be exposed to ultraviolet light and then developed with a conventional additive developer used in the lithographic art. The plate then accepts ink in the area struck by laser beam and accepts water in the non-image areas.

DESCRIPTION OF THE PREFERRED EMBODIMENT

To a sheet of aluminum was applied a coating of the following composition:

| | Parts by Weight |
|---|---|
| Carbon | 3.3 |
| Nitrocellulose | 2.3 |
| Alkyd resin, non-oxidizing | 7.6 |
| Diazo sensitizer (the reaction product of p-diazodiphenylamine-formaldehyde condensation product and sodium lauryl sulfate) | 3.0 |
| Cellulose acetate | 11.5 |
| Butyl acetate | 5.0 |
| Xylene | 3.5 |
| Ethyl cellosolve | 110.0 |

This coating was prepared at 11.1% solids and applied to the aluminum foil using a No. 6 mayer rod. The weight of the dry coating was 1.1 pounds per ream.

An image was etched into the plate by means of a YAG laser beam. The plate was exposed overall to a carbon arc lamp for one minute at a distance of approximately 20 inches. Following this, an additive developer was applied to the plate to develop the image.

The developed plate was mounted on an offset duplicating press and yielded many satisfactory copies. Subsequently, abrasive erasure tests were performed on the plate surface. The results of these tests indicated that the plate would be capable of long run length.

What is claimed is:

1. The method of making an imaged printing plate comprising the steps of:

a. providing a planographic printing plate which comprises, on a substrate, a layer which contains an organic-solvent-soluble negative working diazo compound, carbon particles and a self-oxidating binder;

b. selectively removing areas of said layer by means of a laser beam so as to define on the plate an image which is sensitive to ultraviolet light;

c. exposing the plate overall to ultraviolet light; and d. developing the plate to cause the image areas struck by laser beam to accept ink and the non-image areas to accept water.

2. The method in accordance with claim 1 wherein the laser beam is provided by a YAG laser.

* * * * *

UNITED STATES PATENT OFFICE

CERTIFICATE OF CORRECTION

Patent No. 4,020,762 Dated May 3, 1977

Inventor(s) John O. H. Peterson

It is certified that error appears in the above-identified patent and that said Letters Patent are hereby corrected as shown below:

Title of patent should read:

-- LASER IMAGING A PLANOGRAPHIC PRINTING PLATE --.

Signed and Sealed this

*twenty-third* Day of *August 1977*

[SEAL]

*Attest:*

RUTH C. MASON
*Attesting Officer*

C. MARSHALL DANN
*Commissioner of Patents and Trademarks*